United States Patent
Chu et al.

(10) Patent No.: US 12,333,847 B2
(45) Date of Patent: Jun. 17, 2025

(54) WEARABLE DEVICE AND OPERATING METHOD THEREOF

(71) Applicant: AUO Corporation, Hsinchu (TW)

(72) Inventors: Chia-Hsien Chu, Hsinchu (TW); Chun-Chi Lai, Hsinchu (TW); Ching-Sheng Cheng, Hsinchu (TW)

(73) Assignee: AUO CORPORATION, Hsinchu (TW)

( * ) Notice: Subject to any disclaimer, the term of this patent is extended or adjusted under 35 U.S.C. 154(b) by 0 days.

(21) Appl. No.: 18/885,789

(22) Filed: Sep. 16, 2024

(65) Prior Publication Data

US 2025/0104466 A1    Mar. 27, 2025

(30) Foreign Application Priority Data

Sep. 27, 2023   (TW) ................. 112137169

(51) Int. Cl.
*G06V 40/12*      (2022.01)
*H10K 59/40*     (2023.01)

(52) U.S. Cl.
CPC ......... *G06V 40/1347* (2022.01); *H10K 59/40* (2023.02)

(58) Field of Classification Search
CPC .......... G06V 40/1347; G06V 40/1318; H10K 59/40; G06F 18/00; G06F 3/0412; G06F 3/042
See application file for complete search history.

(56) References Cited

U.S. PATENT DOCUMENTS

| | | | |
|---|---|---|---|
| 9,436,203 B2 | 9/2016 | Ecker et al. | |
| 2014/0111271 A1 | 4/2014 | Fujisawa et al. | |
| 2021/0349598 A1* | 11/2021 | Cheng | G06V 40/1335 |
| 2022/0230009 A1* | 7/2022 | Yao | G06V 40/1306 |
| 2023/0236685 A1* | 7/2023 | Chu | G06F 1/3215 |
| | | | 345/173 |

* cited by examiner

*Primary Examiner* — Abhishek Sarma
(74) *Attorney, Agent, or Firm* — WPAT, PC

(57) ABSTRACT

The present invention provides a wearable device and an operating method thereof. A power circuit provides an analog voltage source to a touch display driver integrated circuit through a first pin; the power circuit provides a digital voltage source to the touch display driver integrated circuit and a fingerprint on display (FOD) recognition circuit through a second pin; and the power circuit provides a first OLED voltage to an organic light-emitting diode (OLED) and the FOD recognition circuit through a third pin, wherein the FOD recognition circuit uses the first OLED voltage as an analog voltage source.

10 Claims, 3 Drawing Sheets

Image non-flickering

———————————————————————————— 35dB
(189nits)

Image flickering

———————————————————————————— 23dB (0.4nits)

Brightness too dim for the human eye to see

WEARABLE DEVICE AND OPERATING METHOD THEREOF

This application claims the benefit of Taiwan Patent application Serial No. 112137169, filed Sep. 27, 2023, the disclosure of which is incorporated by reference herein in its entirety.

TECHNICAL FIELD

The disclosure relates to a wearable device and an operation method thereof.

BACKGROUND

Wearable devices are small electronic devices typically worn on the body or attached to a part of the body. They serve various purposes, offering convenience, monitoring, and interaction in different scenarios. Below are some of the primary uses of wearable devices.
 (1) Health and fitness tracking: Wearable health devices such as smartwatches and fitness trackers can monitor users' steps, heart rate, sleep quality, and other physiological data, helping users stay healthy and achieve fitness goals.
 (2) Smartphone accessories: Wearable devices like smartwatches, smart glasses, and smart bands can connect to smartphones, providing notifications, app control, and even call and message functions, making it easy for users to access information and communication.
 (3) Navigation and location: Some wearable devices have GPS functionality, which can be used for navigation, location tracking, and position tracking, particularly useful during outdoor activities, sports, and travel.
 (4) Productivity tools: Some wearable devices allow users to check schedules, reminders, view emails, or task lists, helping to enhance productivity.
 (5) Augmented Reality (AR) and Virtual Reality (VR) experiences: Smart glasses and head-mounted displays can be used for AR and VR experiences, offering immersive virtual worlds or enhanced reality interaction.
 (6) Monitoring and security: Wearable cameras and body cameras can be used for monitoring and security applications, such as identity recognition, alarm systems, and workplace surveillance.
 (7) Medical and healthcare: Certain wearable devices are designed for medical monitoring, such as heart monitors and diabetes management devices, helping healthcare professionals monitor patients' health conditions.
 (8) Entertainment and media: Wearable devices can also be used for music playback, video watching, and gaming, providing entertainment and media consumption experiences.

The uses of wearable devices are highly diverse, offering a wide range of functions and services to meet different needs and scenarios.

OLED (Organic Light Emitting Diode) technology is commonly used in the display screens of wearable devices. OLED is a unique display technology that differs from traditional LCD (Liquid Crystal Display) screens in that OLED does not require backlighting. Instead, OLED emits light through organic materials. This makes OLED particularly popular in wearable devices because OLED enables thinner, lighter, and more flexible displays with higher contrast and richer color effects. The thinness and lightweight nature of OLED make OLED ideal for integration into small wearable devices like watches, smart bands, and smart glasses, which require compact and lightweight screens. The flexibility of OLED displays allows OLED to be manufactured in curved and flexible shapes, which are important for wearable device design, as OLED can better conform to the body's curves, offering improved comfort. OLED technology can achieve higher pixel density and more vivid colors, providing clearer and richer display effects in wearable devices, which is especially useful for displaying health data, notifications, maps, and other information. OLED technology plays a crucial role in the application of wearable devices, offering high-quality display screens while allowing more flexible design options to meet user needs. Therefore, most modern wearable devices use OLED display technology.

Additionally, wearable devices generally come with fingerprint recognition functionality. Fingerprint recognition technology is often used for identity verification and security features in wearable devices. Here is the relationship between wearable devices and fingerprint recognition.
 (1) Identity verification: Fingerprint recognition technology ensures that only registered users can access data and functions of the wearable device. When a user places their fingertip on the fingerprint sensor of the wearable device, the device can recognize and verify the user's identity, unlocking the device. This provides a convenient and relatively secure way to protect the device from unauthorized access.
 (2) Payment security: Some wearable devices, such as smartwatches, can be used for mobile payments. Fingerprint recognition technology can be used to verify the user's identity to ensure the security of payment transactions. When a user confirms a payment during checkout, fingerprint recognition can be used to authorize the payment.
 (3) Personalized settings: Wearable devices can store multiple users' fingerprints, allowing different users to access the same device and provide personalized experiences based on their settings and preferences. This is useful for shared devices in homes or company devices used by multiple users.
 (4) Security: Fingerprint recognition is generally considered more secure than some other authentication methods because each person's fingerprint is unique and difficult to replicate. This enhances the security of wearable devices, preventing unauthorized access and data breaches.

Fingerprint recognition technology in wearable devices is used for identity verification and security functions, providing a more secure, convenient and personalized user experience. The application of this technology helps ensure the security of devices and user data.

However, in existing wearable devices, reducing the number of pins between the internal circuits to lower costs and reduce the circuit layout area is one of the industry's goals.

Additionally, minimizing the noise seen by the fingerprint recognition sensing circuits in wearable devices is another goal the industry is striving to achieve.

SUMMARY

According to one embodiment, a wearable device is provided. The wearable device includes: a power circuit; a touch display driver integration circuit, coupled to the power circuit, the touch display driver integration circuit performing touch functionality and display driving functionality; an under-display fingerprint recognition circuit, coupled to the power circuit, the under-display fingerprint recognition performing under-display fingerprint recognition functionality; and an organic light-emitting diode (OLED), coupled to the power circuit, the OLED performing illumination and display. The power circuit comprises: a first pin for providing an analog voltage source to the touch display driver integration circuit; a second pin for providing a digital voltage source to the touch display driver integration circuit and the under-display fingerprint recognition circuit; and a third pin for providing a first OLED voltage to the OLED and the under-display fingerprint recognition circuit, wherein the under-display fingerprint recognition circuit uses the first OLED voltage as an analog voltage source.

According to another embodiment, a method of operating a wearable device is provided. The method of operating the wearable device includes: providing, via a first pin of a power circuit, an analog voltage source to a touch display driver integration circuit; providing, via a second pin of the power circuit, a digital voltage source to the touch display driver integration circuit and an under-display fingerprint recognition circuit; and providing, via a third pin of the power circuit, a first OLED voltage to an organic light-emitting diode (OLED) and the under-display fingerprint recognition circuit, wherein the under-display fingerprint recognition circuit uses the first OLED voltage as an analog voltage source.

Figure 1:
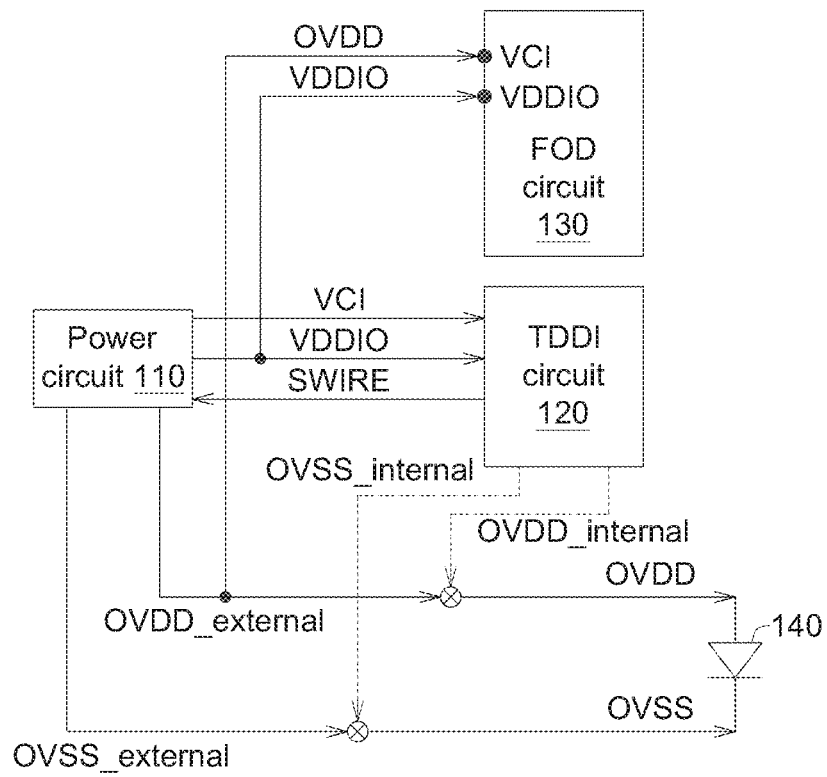
FIG. 1 shows the circuit diagram of a wearable device according to one embodiment of the present application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows the circuit diagram of a wearable device according to one embodiment of the present application. The wearable device 100 includes: a power circuit 110, a touch and display driver integration (TDDI) circuit 120, a fingerprint on display (FOD) circuit 130, and an OLED 140.

The power circuit 110 provides multiple voltage sources to the touch and display driver integration circuit 120, the fingerprint on display circuit 130, and the OLED 140. The power circuit 110 supplies an analog voltage source VCI and a digital voltage source VDDIO to the touch and display driver integration circuit 120. The power circuit 110 also provides the digital voltage source VDDIO and an OLED voltage OVDD_external to the fingerprint on display circuit 130. Specifically, the VDDIO pin of the power circuit 110 is connected to both the touch and display driver integration circuit 120 and the fingerprint on display circuit 130, providing the digital voltage source VDDIO to both the touch and display driver integration circuit 120 and the fingerprint on display circuit 130. Additionally, the OVDD_external pin of the power circuit 110 is connected to both the fingerprint on display circuit 130 and the OLED 140, supplying the OLED voltage OVDD_external to the fingerprint on display circuit 130 (as an analog voltage source) and the OLED 140. The power circuit 110 also supplies the OLED voltages OVDD_external and OVSS_external to the OLED 140. As shown in FIG. 1, the power circuit 110 has five pins: the VCI pin (also referred to as the first pin) provides the analog voltage source VCI to the touch and display driver integration circuit 120; the VDDIO pin (also referred to as the second pin) supplies the digital voltage source VDDIO to both the touch and display driver integration circuit 120 and the fingerprint on display circuit 130; the OVDD_external pin (also referred to as the third pin) supplies the OLED voltage OVDD_external (also called the first OLED voltage) to both the OLED 140 and the fingerprint on display circuit 130; the OVSS_external pin (also referred to as the fourth pin) supplies the OLED voltage OVSS_external (also called the second OLED voltage) to the OLED 140; and the SWIRE pin (also referred to as the fifth pin) receives the signal SWIRE (also called the voltage notification signal) from the touch and display driver integration circuit 120.

The touch and display driver integration circuit 120 is coupled to the power circuit 110. The touch and display driver integration circuit 120 can perform touch functionality and display driving functionality. The architecture of the touch and display driver integration circuit 120 is not described in detail here. The touch and display driver integration circuit 120 provides the SWIRE signal to the power circuit 110 to instruct the power circuit 110 on the voltage levels to supply for the OLED voltage OVDD_external and OVSS_external to the OLED 140. Additionally, the touch and display driver integration circuit 120 provides the OLED voltage OVDD_internal and OVSS_internal (also referred to as the third and fourth OLED voltages) to the OLED 140.

When the OLED 140 is in normal operation mode, the power circuit 110 provides the OLED voltage OVDD_external and OVSS_external to the OLED 140. When the OLED 140 is in idle mode, the touch and display driver integration circuit 120 instead supplies the OLED voltage OVDD_internal and OVSS_internal to the OLED 140.

The fingerprint on display circuit 130 is coupled to the power circuit 110. The fingerprint on display circuit 130 performs fingerprint recognition under the display. The architecture of the fingerprint on display circuit 130 is not described in detail here. The fingerprint on display circuit 130 receives the OLED voltage OVDD_external from the power circuit 110 as its analog voltage source and the fingerprint on display circuit 130 receives the digital voltage source VDDIO from the power circuit 110 as its digital voltage source.

The OLED 140 is coupled to the power circuit 110. The OLED 140 performs the functions of emitting light and displaying images. The architecture of the OLED 140 is not described in detail here.

Figure 2:
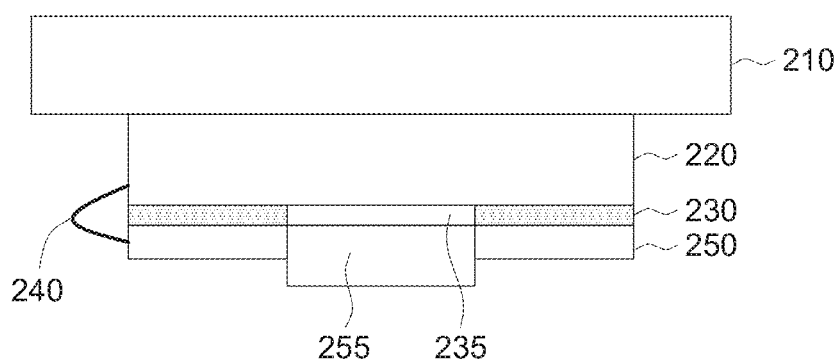
FIG. 2 shows a cross-sectional view of a wearable device according to one embodiment of the present application.

FIG. 2 shows a cross-sectional view of a wearable device according to one embodiment of the present application. The wearable device 200 includes: a tempered glass 210, an OLED panel 220, a double-sided adhesive 230, an air layer 235, a chip on film (COF) 240, a main flexible printed circuit board (FPC) 250, and a fingerprint on display FPC 255.

The tempered glass 210 provides protection. The OLED panel 220 includes multiple OLEDs. The double-sided adhesive 230 is used to bond the OLED panel 220 to the main FPC 250.

The touch and display driver integration circuit 120 is formed within the COF 240.

The main flexible printed circuit board 250 provides the primary FPC functions.

The fingerprint on display circuit 130 is formed within the fingerprint on display FPC 255.

In one embodiment of the present application, during fingerprint recognition, to avoid affecting display quality, the brightness of the "fingerprint recognition area" and the "non-fingerprint recognition area" is adjusted.

Figures 3, 4:
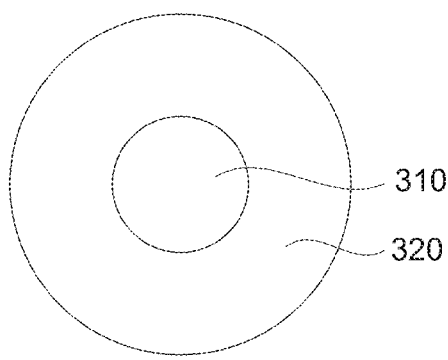
FIG. 3 shows the "fingerprint recognition area" and the "non-fingerprint recognition area" according to one embodiment of the present application.
FIG. 4 shows a schematic diagram of brightness adjustment in the non-fingerprint recognition area according to one embodiment of the present application.

FIG. 3 shows the "fingerprint recognition area" and the "non-fingerprint recognition area" according to one embodiment of the present application. In one embodiment, the non-fingerprint recognition area 310 is located above the fingerprint on display circuit 130. The fingerprint recognition area 310 is defined as a circular region, with a diameter extending outward a certain distance (e.g., 2 mm, not limited to this example) from the diagonal of the sensing area of the fingerprint on display circuit 130 (e.g., 7 mm, not limited to this example), centered on the midpoint of the diagonal of the sensing area of the fingerprint on display circuit 130.

The non-fingerprint recognition area 320 surrounds the fingerprint recognition area 310. In this embodiment, during fingerprint recognition, the brightness of the non-fingerprint recognition area 320 is adjusted to be higher than a first brightness reference value and/or lower than a second brightness reference value. If the non-fingerprint recognition area 320 is a non-solid color area, the non-fingerprint recognition area 320 simultaneously displays multiple brightness levels, which can be higher than the first brightness reference value or lower than the second brightness reference value. Here, the first brightness reference value, for example, is 35 dB (189 nits), not limited to this example; and the second brightness reference value, for example, is 23 dB (0.4 nits), not limited to this example. During fingerprint recognition, the brightness of the fingerprint recognition area 310 is adjusted to a high brightness level (e.g., full white brightness, not limited to this example) or to a level higher than a third brightness reference value.

FIG. 4 shows a schematic diagram of brightness adjustment in the non-fingerprint recognition area 320 according to one embodiment of the present application. As shown in FIG. 4, when the brightness of the non-fingerprint recognition area 320 is higher than the first brightness reference value (e.g., 35 dB (189 nits), not limited to this example), the human eye perceives the image in the non-fingerprint recognition area 320 as non-flickering; when the brightness of the non-fingerprint recognition area 320 is lower than the second brightness reference value (e.g., 23 dB (0.4 nits), not limited to this example), the brightness of the non-fingerprint recognition area 320 is too dim for the human eye to see, so it naturally does not perceive the image as flickering. When the brightness of the non-fingerprint recognition area 320 is between the first and second brightness reference values, the human eye perceives the image as flickering, which negatively affects the user experience. As shown in FIG. 4, the brightness adjustment in this embodiment can avoid this issue.

Figure 5:
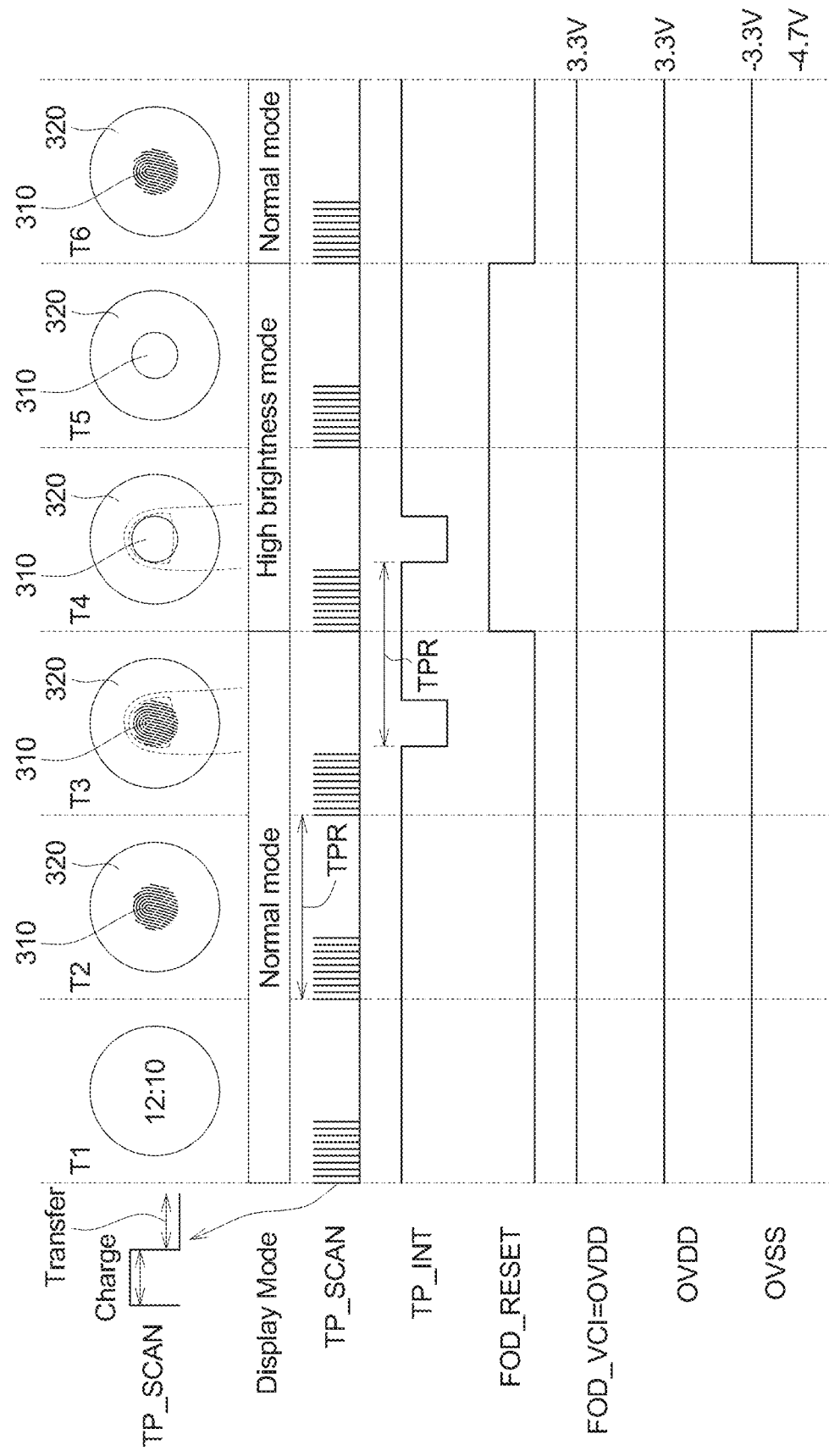
FIG. 5 illustrates a schematic diagram of the operating method of a wearable device according to an embodiment of the present application.

FIG. 5 illustrates a schematic diagram of the operating method of a wearable device according to an embodiment of the present application. TP_SCAN represents a touch scan signal, where TPR stands for the report rate of the touch scan signal TP_SCAN; TP_INT represents the touch interrupt signal; and FOD_RESET represents the activation signal for under-display fingerprint recognition.

At time sequence T1, the wearable device 100 is in normal mode, and the fingerprint recognition screen has not been activated at this time. At time sequence T2, the wearable device 100 remains in normal mode, but the fingerprint recognition screen is activated.

During time sequence T3, a finger is detected entering the fingerprint recognition area, triggering the touch interrupt signal TP_INT. At time sequence T4, in response to the triggering of the touch interrupt signal TP_INT, the under-display fingerprint recognition activation signal FOD_RESET is enabled (i.e., the under-display fingerprint recognition function is activated), and the wearable device 100 enters high brightness mode (HBM). When entering high brightness mode, the brightness of the fingerprint recognition area (310) is high, and the brightness of the non-fingerprint recognition area (320) is adjusted to be greater than a first brightness reference value and/or less than a second brightness reference value. In normal mode, the OVSS voltage of the OLED is, for example, −3.3V. When entering high brightness mode, due to the increased current of the OLED, the OVSS voltage of the OLED is lowered to, for example, −4.7V for achieving a larger OLED cross voltage.

At time sequence T5, when the finger is detected leaving the fingerprint recognition area, the touch interrupt signal TP_INT is no longer triggered. Therefore, at time sequence T6, the under-display fingerprint recognition activation signal FOD_RESET is disabled (i.e., the under-display fingerprint recognition function is turned off), and the wearable device 100 returns to normal mode. When returning to normal mode, the brightness of the fingerprint recognition area (310) and the brightness of the non-fingerprint recognition area (320) both return to normal.

When the under-display fingerprint recognition circuit receives the OLED voltage provided by the power circuit (such as OLED_external in FIG. 1) as the analog voltage source, this coupling relationship may sometimes negatively impact the visual effects of the display. Therefore, to ensure that the display is not disturbed, in this embodiment, the fingerprint recognition function can only be used when the following three conditions are met simultaneously: 1. the fingerprint recognition screen is activated; 2. high brightness mode is enabled; 3. FOD (fingerprint on display, under-display fingerprint recognition) is enabled. These requirements ensure that the under-display fingerprint recognition does not adversely affect the display.

In this embodiment, the under-display fingerprint recognition circuit 130 is only activated when fingerprint recognition is performed, and is otherwise kept off to avoid affecting the display.

As can be seen from the above, in this embodiment, the number of pins between the power circuit of the wearable device and other circuits (the touch display driver integration circuit and the under-display fingerprint recognition circuit) is reduced, thereby lowering the cost and reducing the circuit layout area of the wearable device according to this embodiment.

Furthermore, by having the under-display fingerprint recognition circuit 130 receive the OLED voltage OVDD_external provided by the power circuit 110 as the analog voltage source, noise can be reduced.

Although the application may describe many specific details, these should not be construed as limiting the scope of the claimed invention but should be viewed as descriptions of characteristics of specific embodiments. In this description, certain characteristics described in the context of a single embodiment may also be implemented in combination in a single embodiment. Conversely, various characteristics described in the context of a single embodiment can be implemented individually or in any suitable sub-combination across multiple embodiments. Additionally, although characteristics may initially be described as functioning in certain combinations or initially described as such combinations, in some cases, one or more characteristics can be removed from that combination, and the described combination may apply to a sub-combination or a variation of a sub-combination. Similarly, although operations are depicted as being performed in a specific sequence in the illustrations, this should not be understood as requiring that these operations must be performed in the specific order shown, or sequentially, or that all operations depicted must be performed to achieve the desired result.

Although the above embodiments of the application only disclose some examples and implementations, based on the disclosed content, changes, modifications, and enhancements can be made to the described examples and implementations as well as other implementations.

In conclusion, although the invention has been disclosed above using embodiments, it is not intended to limit the invention. A person skilled in the relevant art, without departing from the spirit and scope of the invention, can make various changes and modifications. Therefore, the protection scope of the invention should be determined by the attached claims.

What is claimed is:

1. A wearable device, comprising:
    a power circuit;
    a touch display driver integration circuit, coupled to the power circuit, the touch display driver integration circuit performing touch functionality and display driving functionality;
    an under-display fingerprint recognition circuit, coupled to the power circuit, the under-display fingerprint recognition circuit performing under-display fingerprint recognition functionality; and
    an organic light-emitting diode (OLED), coupled to the power circuit, the OLED performing illumination and display,
    wherein the power circuit comprises: a first pin for providing an analog voltage source to the touch display driver integration circuit; a second pin for providing a digital voltage source to the touch display driver integration circuit and the under-display fingerprint recognition circuit; and a third pin for providing a first OLED voltage to the OLED and the under-display fingerprint recognition circuit, wherein the under-display fingerprint recognition circuit uses the first OLED voltage as an analog voltage source.

2. The wearable device according to claim 1, wherein
    a fingerprint recognition area is located above the under-display fingerprint recognition circuit,
    the fingerprint recognition area is defined by extending a predetermined distance from a diagonal of a sensing area of the under-display fingerprint recognition circuit as a circle diameter, and using a center point of the diagonal of the sensing area as a circle center; and
    a non-fingerprint recognition area surrounds the fingerprint recognition area.

3. The wearable device according to claim 2, wherein when performing fingerprint recognition:
    a brightness of the non-fingerprint recognition area is adjusted to be greater than a first brightness reference value and/or less than a second brightness reference value, and
    a brightness of the fingerprint recognition area is adjusted to be higher than a third brightness reference value.

4. The wearable device according to claim 3, wherein
    at a first time sequence, the wearable device is in a normal mode;
    at a second time sequence, the wearable device is in the normal mode, and a fingerprint recognition screen is activated;
    at a third time sequence, a touch interrupt signal is triggered;
    at a fourth time sequence, in response to triggering of the touch interrupt signal, a under-display fingerprint recognition function is activated, and the wearable device enters a high brightness mode, wherein, when entering the high brightness mode, the brightness of the fingerprint recognition area is adjusted to be higher than the third brightness reference value, and the brightness of the non-fingerprint recognition area is adjusted to be greater than the first brightness reference value and/or less than the second brightness reference value;
    at a fifth time sequence, triggering of the touch interrupt signal is canceled; and
    at a sixth time sequence, the under-display fingerprint recognition function is turned off, and the wearable device returns from the high brightness mode to the normal mode.

5. The wearable device according to claim 1, wherein
    a fingerprint recognition function of the under-display fingerprint recognition circuit is activated only when a fingerprint recognition screen is activated, a high brightness mode is enabled, and an under-display fingerprint recognition function is turned on.

6. A method of operating a wearable device, comprising:
    providing, via a first pin of a power circuit, an analog voltage source to a touch display driver integration circuit;
    providing, via a second pin of the power circuit, a digital voltage source to the touch display driver integration circuit and an under-display fingerprint recognition circuit; and
    providing, via a third pin of the power circuit, a first OLED voltage to an organic light-emitting diode (OLED) and the under-display fingerprint recognition circuit, wherein the under-display fingerprint recognition circuit uses the first OLED voltage as an analog voltage source.

7. The method of operating the wearable device according to claim 6, wherein:
    a fingerprint recognition area is located above the under-display fingerprint recognition circuit,
    the fingerprint recognition area is defined by extending a predetermined distance from a diagonal of a sensing area of the under-display fingerprint recognition circuit as a circle diameter, and using a center point of the diagonal of the sensing area as a circle center; and a non-fingerprint recognition area surrounds the fingerprint recognition area.

8. The method of operating the wearable device according to claim 7, wherein when performing fingerprint recognition:

a brightness of the non-fingerprint recognition area is adjusted to be greater than a first brightness reference value and/or less than a second brightness reference value, and a brightness of the fingerprint recognition area is adjusted to be higher than a third brightness reference value.

9. The method of operating the wearable device according to claim 8, wherein:

at a first time sequence, the wearable device is in a normal mode;

at a second time sequence, the wearable device is in the normal mode, and a fingerprint recognition screen is activated;

at a third time sequence, a touch interrupt signal is triggered;

at a fourth time sequence, in response to triggering of the touch interrupt signal, a under-display fingerprint recognition function is activated, and the wearable device enters a high brightness mode, wherein, when entering the high brightness mode, the brightness of the fingerprint recognition area is adjusted to be higher than the third brightness reference value, and the brightness of the non-fingerprint recognition area is adjusted to be greater than the first brightness reference value and/or less than the second brightness reference value;

at a fifth time sequence, triggering of the touch interrupt signal is canceled; and at a sixth time sequence, the under-display fingerprint recognition function is turned off, and the wearable device returns from the high brightness mode to the normal mode.

10. The method of operating the wearable device according to claim 6, wherein:

an under-display fingerprint recognition function is activated only when a fingerprint recognition screen is activated, a high brightness mode is enabled, and an under-display fingerprint recognition function is turned on.

* * * * *